(12) United States Patent
Sun et al.

(10) Patent No.: US 9,349,608 B2
(45) Date of Patent: May 24, 2016

(54) METHODS OF PROTECTING A DIELECTRIC MASK LAYER AND RELATED SEMICONDUCTOR DEVICES

(71) Applicant: GLOBALFOUNDRIES Inc., Grand Cayman (KY)

(72) Inventors: Zhiguo Sun, Halfmoon, NY (US); Daniel Smith, Ballston Spa, NY (US); Kumarapuram Gopalakrishnan, Malta, NY (US); Hung-Wei Liu, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 8 days.

(21) Appl. No.: 14/106,340

(22) Filed: Dec. 13, 2013

(65) Prior Publication Data

US 2015/0171001 A1 Jun. 18, 2015

(51) Int. Cl.

| | |
|---|---|
| *H01L 23/48* | (2006.01) |
| *H01L 23/52* | (2006.01) |
| *H01L 21/3205* | (2006.01) |
| *H01L 21/768* | (2006.01) |
| *H01L 23/31* | (2006.01) |
| *H01L 23/29* | (2006.01) |
| *H01L 21/308* | (2006.01) |
| *H01L 21/311* | (2006.01) |
| *H01L 21/321* | (2006.01) |

(52) U.S. Cl.
CPC ...... *H01L 21/32051* (2013.01); *H01L 21/3081* (2013.01); *H01L 21/31138* (2013.01); *H01L 21/31144* (2013.01); *H01L 21/3212* (2013.01); *H01L 21/76846* (2013.01); *H01L 21/76898* (2013.01); *H01L 23/291* (2013.01); *H01L 23/3192* (2013.01); *H01L 23/481* (2013.01); *H01L 2924/0002* (2013.01)

(58) Field of Classification Search
CPC .................. H01L 23/5226; H01L 21/76802
USPC ........................................ 257/751
See application file for complete search history.

(56) References Cited

U.S. PATENT DOCUMENTS

| | | | |
|---|---|---|---|
| 6,780,761 B1* | 8/2004 | Wu ................. | H01L 21/76826 257/E21.579 |
| 2007/0040239 A1* | 2/2007 | Chinthakindi ...... | H01L 23/5228 257/536 |
| 2007/0077761 A1* | 4/2007 | Lehr et al. ..................... | 438/687 |
| 2008/0113521 A1* | 5/2008 | Tanaka ................ | H01L 21/3185 438/792 |
| 2008/0179747 A1* | 7/2008 | Sakai et al. .................... | 257/751 |
| 2008/0203570 A1* | 8/2008 | Edelstein .......... | H01L 21/76805 257/751 |
| 2009/0206485 A1* | 8/2009 | Yang et al. ..................... | 257/751 |

(Continued)

*Primary Examiner* — Andy Huynh
*Assistant Examiner* — Sitaramarao S Yechuri
(74) *Attorney, Agent, or Firm* — Heslin Rothenberg Farley & Mesiti, P.C.

(57) ABSTRACT

Devices and methods for forming semiconductor devices with a protection layer for a dielectric mask layer are provided. One method includes, for instance; obtaining a substrate having at least one of a dielectric layer and a metal layer; forming a first SiCN dielectric mask layer on a top surface of at least one of the dielectric layer and a metal layer; and forming a silicon nitride (SiNx) cap layer on a top surface of the first SiCN dielectric mask layer. One intermediate semiconductor device includes, for instance: a substrate having at least one of a dielectric layer and a metal layer; a first SiCN dielectric mask layer on a top surface of at least one of the dielectric layer and a metal layer; and a silicon nitride (SiNx) cap layer on a top surface of the first SiCN dielectric mask layer.

16 Claims, 6 Drawing Sheets

(56) References Cited

U.S. PATENT DOCUMENTS

| | | | |
|---|---|---|---|
| 2009/0309226 A1* | 12/2009 | Horak et al. | 257/762 |
| 2010/0044864 A1* | 2/2010 | Maekawa et al. | 257/751 |
| 2010/0320604 A1* | 12/2010 | Isobayashi | H01L 21/76805 257/751 |
| 2012/0119366 A1* | 5/2012 | Li | H01L 23/5226 257/751 |
| 2013/0056811 A1* | 3/2013 | Lin | H01L 27/11507 257/295 |

* cited by examiner

METHODS OF PROTECTING A DIELECTRIC MASK LAYER AND RELATED SEMICONDUCTOR DEVICES

FIELD OF THE INVENTION

The present invention relates to methods of fabricating semiconductor devices and semiconductor devices, and more particularly to methods of fabricating semiconductor devices and semiconductor devices with a silicon nitride (SiNx) cap layer on a dielectric layer.

BACKGROUND OF THE INVENTION

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

Aspects of semiconductor fabrication have focused on providing highly integrated semiconductor devices. Such semiconductor devices may include metal wirings on a circuit having a micro line width whereby the distance between the lines is also very small. In order to reduce the size of the devices, a multi-layered wiring structure may be required. The multi-layered wirings may require dielectric layers for providing electrical insulation between the components. In some applications, dielectric layers for providing electrical isolation between components, such as metal wirings, may be formed by depositing tetraethyl orthosilicate ($Si(OC_2H_5)_4$) (hereinafter TEOS) using plasma enhanced chemical vapor deposition methods. In some other embodiments, the dielectric layers may be a low k dielectric material.

In the process of connecting and interconnecting electrical circuit elements with patterned conductor layers which are separated by the dielectric layers, for example, it is common in the art of integrated circuit fabrication to form vias and other apertures through the dielectric layers such that conductive connections may be made between the patterned conductor layers and the electrical circuit elements which are separated by the dielectric layers. Vias and other apertures within and/or through dielectric layers, such as a PMD layer, of integrated circuits are commonly formed through photolithographic methods followed by etch methods.

For example, in some typical sub 20 nanometer semiconductor applications a silicon carbonitride (SiCN) dielectric mask layer is formed on a substrate (e.g., silicon wafer) over a PMD dielectric layer and/or a metal layer. In some such embodiments the SiCN dielectric mask layer is a nitrogen-doped silicon carbide mask layer. In some embodiments the dielectric layer is a TEOS or a low k dielectric material. In some embodiments the metal layer is a layer of W, Al and/or Cu.

The SiCN dielectric mask layer not only serves as a mask layer, but as a chemical-mechanical planarization (CMP) stopping layer and a metal layer cap (e.g., copper contacts to source/drain, gate, etc lined with tungsten). Degradation of the dielectric mask layer during fabrication would thereby result in interlayer leakage, which in turn leads to performance loss in the resulting integrated circuit.

A photoresist layer is typically deposited on the SiCN dielectric mask layer, which is deposited on a dielectric layer and/or a metal layer. The photoresist layer is utilized by etching processes to form an opening or through-silicon via (TSV) hole or trench for the formation of a TSV through the layers. After the opening or TSV hole is formed via etching (and after potentially ion implantation), the photoresist is removed from the SiCN dielectric mask layer by ashing, and then the SiCN dielectric mask layer is wet cleaned by diluted HF solution.

The removal of the photoresist after etching is one of the most important and frequently performed steps in front-end semiconductor manufacturing. Depending on the complexity of the devices concerned, many lithography cycles are required and each cycle requires a photoresist removal process, potentially from SiCN dielectric mask layer that also serves as a chemical-mechanical planarization (CMP) stopping layer and a contact capping layer (as described above). Removal of photoresist can be achieved several ways. Positive photoresist can be removed using acetone followed by water rinse. Other less flammable and more aggressive solvents can be used on both negative and positive resists. A dry technique of photoresist stripping, "ashing," involves removal by volatilization of the photoresist (e.g., organic materials) from the SiCN dielectric mask layer using strongly oxidizing ambient. The preferred type of the ashing stripping approach is oxygen plasma ashing because it uses only small amounts of oxygen and does not include the chemical waste problems associated with other removal methods. In essence, oxygen plasma ashing involves combining oxygen with the photoresist via oxygen plasma to form ash which is removed by a vacuum pump. In this way, the process of oxygen plasma ashing is usually restricted to the removal of the organic matter of the photoresist by oxygen plasma. The by-products of oxygen plasma ashing are typically carbon oxides and water vapor, which are volatile and typically pumped away by the vacuum system.

Oxygen plasma ashing of photoresist on an SiCN dielectric mask layer can lead to degradation of the SiCN dielectric mask layer. For example, the oxygen of the oxygen plasma of the ashing process can deplete at least a substantial portion the carbon of the SiCN dielectric mask layer (e.g., a SiCNH layer) and thereby leave the SiCN dielectric mask layer substantially weak. In some such scenarios, the SiCN dielectric mask layer may contain about 10 to about 30 wt % carbon, and substantially all of the carbon may be depleted from at least some portions of the SiCN dielectric mask layer. The weak, carbon-depleted SiCN dielectric mask layer is then removed or stripped from the dielectric layer and/or a metal layers during the ashing, cleaning and/or other subsequent process steps. For example, at least about 40% of the weak, carbon-depleted SiCN dielectric mask layer can be removed from the dielectric layer and/or metal layers during the ashing, cleaning and/or other subsequent process steps. In some embodiments, at least some portions of the weak, carbon-depleted SiCN dielectric mask layer is completely removed from the dielectric layer and/or metal layers during the ashing, cleaning and/or other subsequent process steps. As the SiCN dielectric mask layer serves as a mask layer, a chemical-mechanical planarization (CMP) stopping layer, and a metal layer capping layer (as described above), the at least partial removal of the SiCN dielectric mask layer can lead to interlayer leakage and thereby performance loss in the resulting integrated circuit.

Thus, the fabrication of a semiconductor device with can be problematic with existing fabrication techniques and improved device fabrication techniques are needed for forming devices with a substantially intact or at least substantially effective dielectric mask layer applied over a dielectric layer and/or a metal layer.

BRIEF SUMMARY

There is set forth herein, in one aspect, a method of forming a semiconductor device that includes, for instance: obtaining a substrate having at least one of a dielectric layer and a metal layer; forming a first SiCN dielectric mask layer on a top surface of at least one of the dielectric layer and a metal layer; and forming a silicon nitride (SiNx) cap layer on a top surface of the first SiCN dielectric mask layer.

There is set forth herein, in another aspect, an intermediate semiconductor device which includes, for instance: a substrate having at least one of a dielectric layer and a metal layer; a first SiCN dielectric mask layer on a top surface of at least one of the dielectric layer and a metal layer; and a silicon nitride (SiNx) cap layer on a top surface of the first SiCN dielectric mask layer.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

An integrated circuit (IC) device (also referred to as a semiconductor chip) can contain millions of transistors and other circuit elements that are fabricated on a single silicon crystal substrate (wafer). For the IC device to be functional, a complex network of signal paths will normally be routed to connect the circuit elements distributed on the surface of the device. Efficient routing of these signals across the device can become more difficult as the complexity and number of circuit elements is increased. Thus, the formation of multi-level or multi-layered interconnection schemes have become more desirable due to their efficacy in providing high speed signal routing patterns between large numbers of transistors and other circuit elements on a complex IC.

Generally, damascene techniques involve depositing a dielectric layer, forming an opening in the dielectric layer and forming a trench, overfilling the opening and trench with a metal, such as copper (Cu), and removing excess metal using chemical-mechanical polishing (CMP) and buffer polishing resulting in a planarized interconnect structure. This results in a single "wiring level" or "interconnect level" of an overall "interconnect structure" having many wiring levels. The opening in the interconnect level may be a via, extending substantially perpendicular to the top surface of IC completely through the dielectric layer for connecting an overlying wire of a higher wiring level or of the present wiring level to an underlying wire of a lower wiring level. A filled via is typically simply referred to as a "via." Through-silicon vias (TSV) are typically fabricated to provide a through-via filled with a conducting material that pass completely through layer(s) to contact and connect with the other TSVs and conductors of the other layers.

Figure 4:
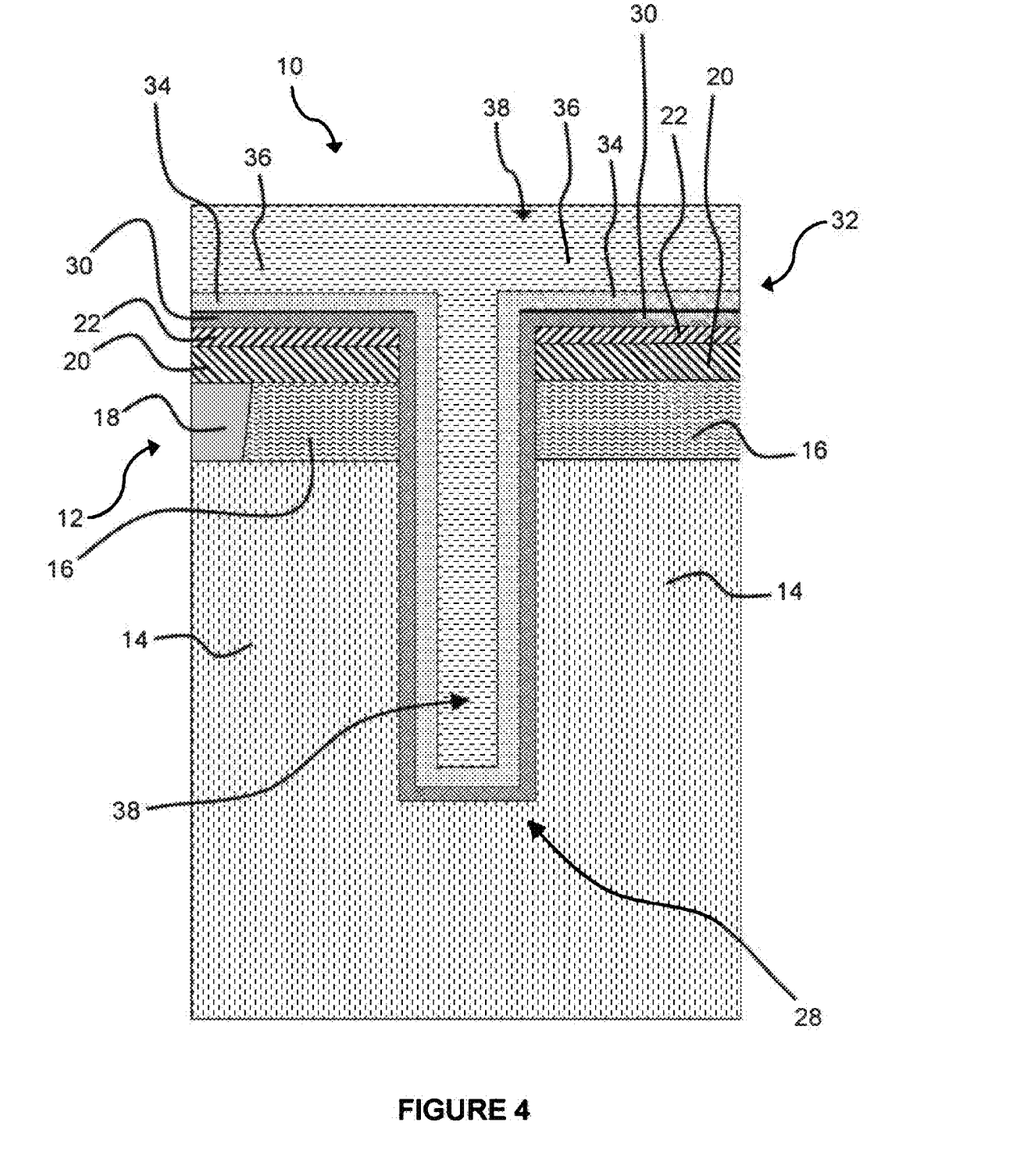
FIG. 4 depicts exemplary embodiments of a process for fabricating, for instance, semiconductor devices and intermediate semiconductor devices with a dielectric mask protection layer, in accordance with one or more aspects of the present invention.
Figure 5:
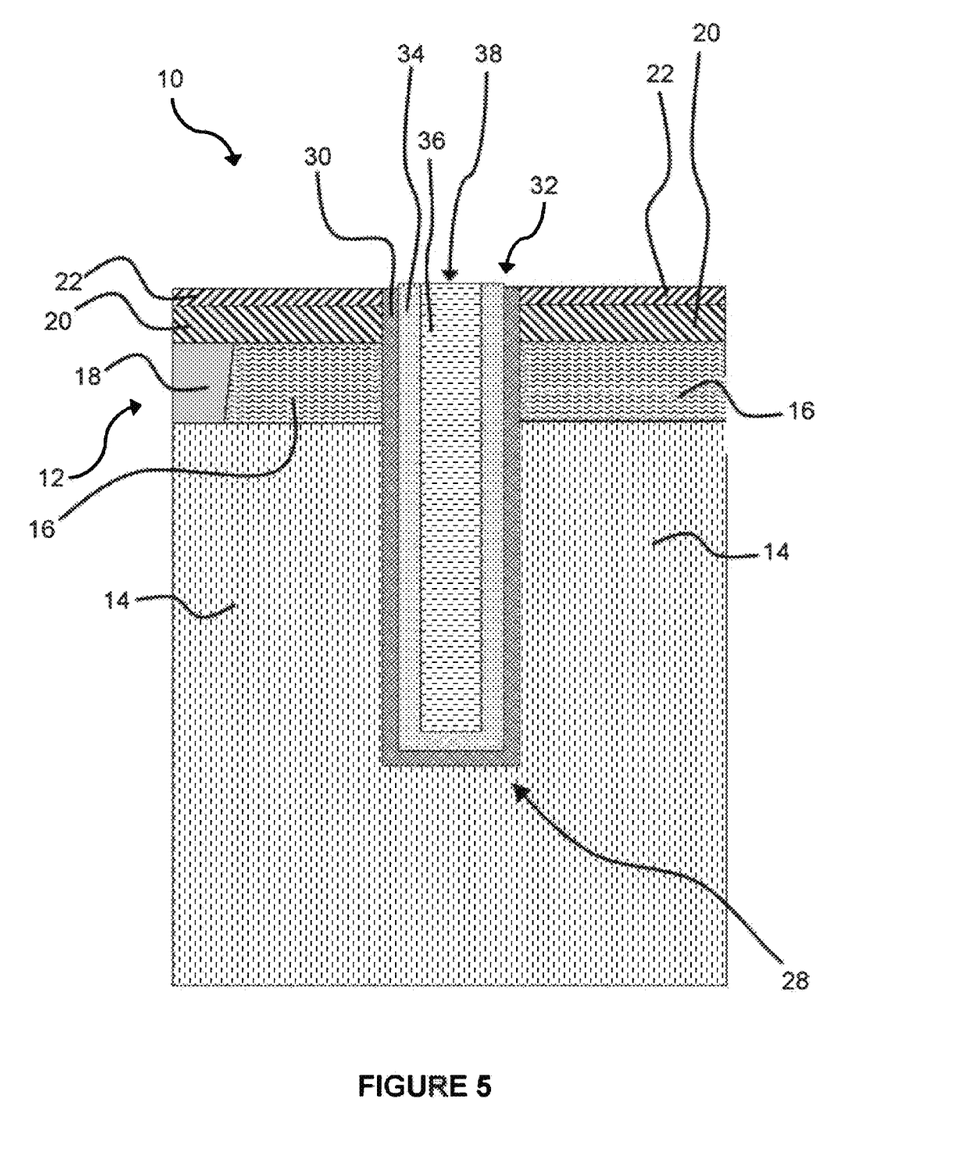
FIG. 5 depicts exemplary embodiments of a process for fabricating, for instance, semiconductor devices and intermediate semiconductor devices with a dielectric mask protection layer, in accordance with one or more aspects of the present invention.
Figure 6A:
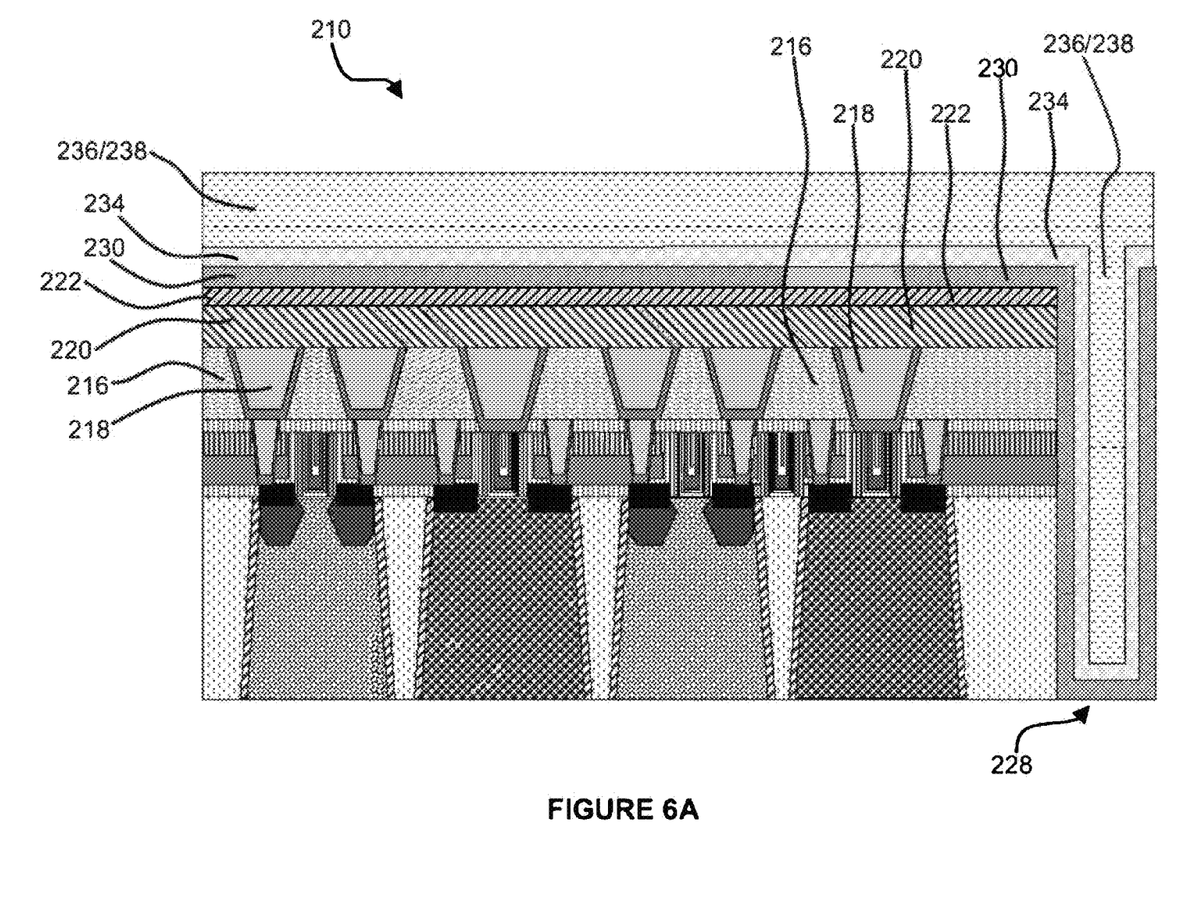
FIG. 6A depicts a portion of an intermediate semiconductor device before chemical-mechanical polishing of the device, in accordance with one or more aspects of the present invention.

FIGS. 1-5 illustrate improved manufacturing processes or methods of a BEOL (back end of line) intermediate semiconductor device 10 including a first interconnect level 12 on a substrate 14, such as a semiconductor Si wafer, that may include a plurality of logic circuit elements such as transistors (see FIG. 6A). It should clearly be understood that FIGS. 1-5 illustrate an extremely small (microscopic) portion of an exemplary integrated circuit (IC) device, let alone a semiconductor wafer comprising a very large number of such devices. However, for one of ordinary skill in the art to which the disclosure most nearly pertains, FIGS. 1-5 (and FIG. 6A) are informative of the general principals of the disclosure, especially when taken in context of the associated descriptive text.

Figure 1:
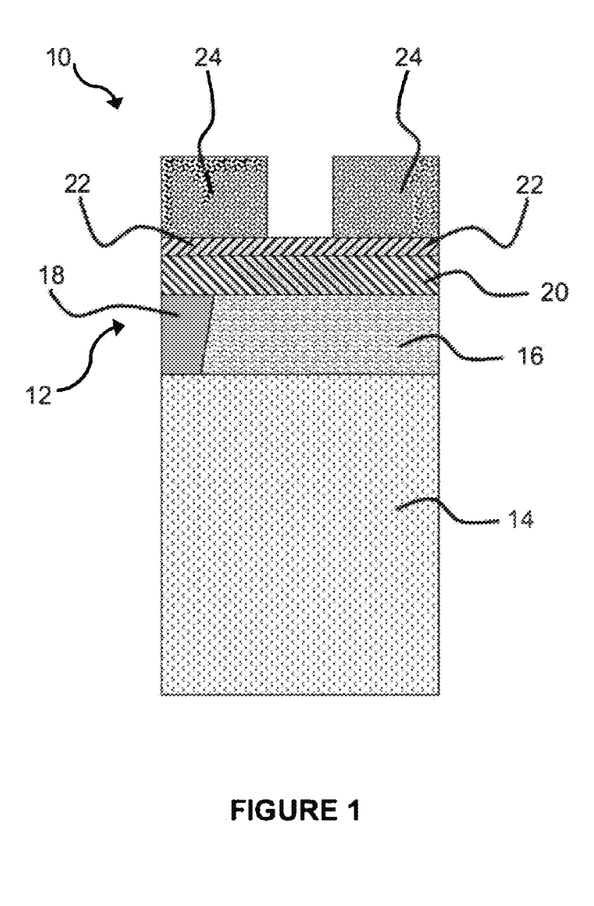
FIG. 1 depicts exemplary embodiments of a process for fabricating, for instance, semiconductor devices and intermediate semiconductor devices with a dielectric mask protection layer, in accordance with one or more aspects of the present invention.

In some exemplary embodiments, as shown in FIG. 1, the method of forming a intermediate semiconductor device 10 may include forming, providing or obtaining a substrate 14. A first interconnect level 12 may include, or be formed on, the substrate 14. The first interconnect level 12 may include at least one of a dielectric layer 16 and a metal layer 18, as shown in the exemplary embodiment in FIG. 1. The dielectric layer 16 may be formed or deposited on the substrate 14 through a chemical vapor deposition (CVD) process. In some such embodiments, the dielectric layer 16 may be a pre-metal dielectric layer. In some embodiments, the dielectric layer 16 may be substantially an oxide or low-k SiCOH type material. In some such embodiments, the dielectric layer 16 may substantially be a tetraethyl orthosilicate (TEOS) layer. The metal layer 18 may be one or more contacts, such as a CA or CB. In some embodiments, the metal of the metal layer 18 may be W, Al or Cu. In some embodiments, the metal layer 18 may be interspersed with, or provided in holes in, the dielectric layer 16 as shown in FIG. 1.

As also shown in FIG. 1, in some exemplary embodiments the method of forming a semiconductor device 10 may include forming, providing or obtaining a first silicon carbonitride (SiCN) dielectric mask layer 20 on a top surface of at least one of the dielectric layer 16 and/or metal layer 18. In some such embodiments the SiCN dielectric mask layer 20 may be a nitrogen-doped silicon carbide mask layer. In some embodiments, the SiCN dielectric mask layer 20 may be SiCNH. The first SiCN dielectric mask layer 20 may be deposited via a plasma enhanced chemical vapor deposition (PECVD) process. In some such embodiments, the PECVD process deposits the SiCN dielectric mask layer 20 by utilizing TMS at a flow rate within the range of about 100 to about 600 sccm and NH3 at a flow rate within the range of about 500 to about 5000 sccm, with optional diluted gas such as N2, He or Ar under plasma environment ignited by High Frequency Radio Frequency (HFRF) varies from 50 w to 1000 w.

The as-deposited first SiCN dielectric mask layer 20 may have a thickness of about 5 to about 50 nm. In some such embodiments, the as-deposited first SiCN dielectric mask layer 20 may have a thickness of about 20 to about 30 nm. In some embodiments, the as-deposited first SiCN dielectric mask layer 20 may have a thickness of about 20 to about 30 nm. As shown in FIG. 1, the SiCN dielectric mask layer 20 may serve as a mask layer, a chemical-mechanical planarization (CMP) stopping layer (described further below) and a cap to the metal layer 18 (e.g., CA, CB, etc.). Degradation of the dielectric mask layer 20 during fabrication would thereby result in interlayer leakage, which in turn leads to performance loss in the resulting integrated circuit.

As also shown in FIG. 1, in some exemplary embodiments the method of forming a semiconductor device 10 may include forming, providing or obtaining a silicon nitride (SiNx) cap layer 22 on a top surface of the first SiCN dielectric mask layer 20 to protect the SiCN dielectric mask layer 22 from further processing of the semiconductor device 10, as described further below. The SiNx cap layer 22 may be deposited via a PECVD process. In some such embodiments, the PECVD process deposits the SiNx cap layer 22 by utilizing N2 at a flow rate within the range of about 1,000 to about 20,000 sccm and SiH4 at a flow rate within the range of about 50 to about 500 sccm. The as-deposited SiNx cap layer 22 may have a thickness of about 1 to about 6 nm. In some such embodiments, the as-deposited SiNx cap layer 22 may have a thickness of about 3 to about 4 nm. In some embodiments the as-deposited SiNx cap layer 22 has a thickness non-uniformity (NU %) of less than or equal to about 2%, and potentially less than or equal to about 1.75%. The term thickness non-uniformity is used herein as the standard deviation of forty-nine (49) thickness measurements take about the semiconductor device 10 divided by the average of the forty-nine (49) points, and multiplied by 100.

As further shown in FIG. 1, in some exemplary embodiments the method of forming a semiconductor device 10 may include forming, providing or obtaining a light-sensitive chemical or "photoresist" layer 24 on a top surface of the silicon nitride (SiNx) cap layer 22. In some embodiments the photoresist 24 may be amorphous Carbon. The photoresist 24 may be deposited on the SiNx cap layer 22 via a PECVD process. In some such embodiments, the as-deposited photoresist 24 may have a thickness of 500 to about 5000 nm.

Figure 2:
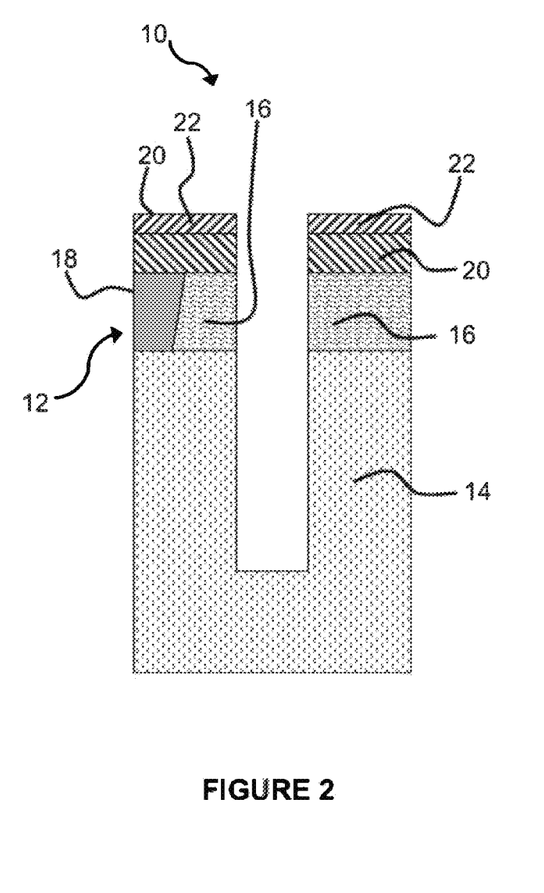
FIG. 2 depicts exemplary embodiments of a process for fabricating, for instance, semiconductor devices and intermediate semiconductor devices with a dielectric mask protection layer, in accordance with one or more aspects of the present invention.

The photoresist layer 24 may be utilized by etching processes to form an opening 26 in at least the SiNx cap layer 22, the first SiCN dielectric mask layer 20 and the dielectric layer 16 (and potentially the substrate 14) for the formation of a TSV therethrough, as shown in FIG. 2. One or more etching process may be used with the photoresist 24 to form an opening 26 in the SiNx cap layer 22, the first SiCN dielectric mask layer 20, the dielectric layer 16 and, potentially, the substrate 14. For example, SF6 etching and C4F8 polymerization may be utilized with the photoresist 24 (see FIG. 1) to form an opening 26 and a trench 28 into at least the SiNx cap layer 22, the first SiCN dielectric mask layer 20, and the dielectric layer 20 (and potentially the substrate 14).

As also shown in FIG. 2, after formation of the via opening 26 and trench 28 in SiNx cap layer 22, the first SiCN dielectric mask layer 20, and the dielectric layer 20 (and potentially the substrate 14) via the photoresist 24 (FIG. 1) and etching, the photoresist 24 (FIG. 1) may be removed from the SiNx cap layer 22. In some exemplary embodiments, the method of forming a semiconductor device 10 includes removing the photoresist 24 by performing a dry technique of photoresist stripping, i.e., "ashing." Ashing of the photoresist 24 may involve removal of the photoresist 24 by volatilization of the photoresist 24 (e.g., organic materials) by using strongly oxidizing ambient. In some embodiments, ashing of the photoresist 24 utilizes oxygen plasma ashing. Oxygen plasma ashing is advantageous as it uses only small amounts of oxygen and does not include the chemical waste problems potentially associated with other removal methods. In the oxygen plasma ashing process, oxygen may be combined with the photoresist 24 via the oxygen plasma to form ash. In some such embodiments, the resulting ash may be removed by a vacuum pump. Similarly, the by-products of oxygen plasma ashing may be carbon oxides and water vapor, which may also be pumped away from the intermediate semiconductor device 10 by the vacuum system. It is noted that without the SiNx cap layer 22, because the SiCN dielectric mask layer 20 may contain about 10 to about 30 wt % carbon, and substantially all of the carbon may be depleted from at least some portions of the SiCN dielectric mask layer 20 by the ashing process, the ashing process may substantially deteriorate and strip the SiCN dielectric mask layer 20 from the dielectric layer 16 and/or metal layer 18 (as discussed further below).

After the photoresist 24 is removed from SiNx cap layer 22 via oxygen-based ashing, the semiconductor device 10 may be cleaned. For example, in some embodiments the top surface of the SiNx cap layer 22 and the TSV trench 28 may be cleaned by a wet clean or a dry clean or a sputter clean process. After cleaning, the metrology of the semiconductor device 10 may be analyzed. For example, in some embodiments after the semiconductor device 10 is cleaned post etching and ashing, the depth of the TSV trench, CD, BCD, sidewall roughness, and wafer warping metrics of the intermediate semiconductor device 10 may be checked to ensure such metrics are within acceptable tolerances.

In some embodiments, the etching, ashing and cleaning process of the intermediate semiconductor device 10 may not entirely remove or substantially deteriorate the SiNx cap layer 22. Stated differently, at least a portion of the thickness of the SiNx cap layer 22 may remain on the SiCN dielectric mask layer 20 after the etching, ashing and cleaning process. For example, only a portion of the thickness of the SiNx cap layer 22 may be removed or deteriorated by the removal of the photoresist 24 via the ashing process. In some other embodiments, the entire thickness of at least a portion of the SiNx cap layer 22 may be deteriorated, stripped or otherwise removed by the etching, ashing and cleaning processes.

In prior art processes, the photoresist 24 would be deposited directly on the SiCN dielectric mask layer 20 (i.e., without the SiNx cap layer 22 therebetween). After etching of the opening 26 of the TSV hole or trench 28, removal of the photoresist 24 via oxygen-based plasma ashing would substantially degrade the SiCN dielectric mask layer 20. For example, the oxygen of the oxygen plasma of the ashing process would deplete at least a substantial portion the carbon of the SiCN dielectric mask layer 20 and thereby leave the first SiCN dielectric mask layer 20 substantially weak. In some such scenarios, the SiCN dielectric mask layer 20 may contain about 20 wt % carbon, and substantially all of the carbon may be depleted from at least some portions of the SiCN dielectric mask layer 20. The weak, carbon-depleted SiCN dielectric mask layer 20 would then be removed or stripped from the dielectric layer 16 and/or metal layer 18 during the ashing, cleaning and/or other subsequent processes (as described further below). For example, at least about 25%, and potentially at least abut 40%, of the thickness of the weak, carbon-depleted SiCN dielectric mask layer 20 may be removed from portions of the dielectric layer 16 and/or metal layers 18 during the oxygen ashing (and, potentially, cleaning and/or other subsequent process steps before the SiCN dielectric mask layer 20 is utilized as a stop layer, as described further below) when the SiCN dielectric mask layer 20 is not protected by the SiNx cap layer 22. In some embodiments, at least some portions of the weak, carbon-depleted SiCN dielectric mask layer 20 are completely removed from the dielectric layer 16 and/or metal layers 18 during the ashing, cleaning and/or other subsequent process steps. In some embodiments, oxygen-based ashing of an unprotected SiCN dielectric mask layer 20 may result in an oxygen atomic concentration (AES) percentage of at least about 48% and oxygen penetration to at least about 10 nanometers.

As the SiCN dielectric mask layer 20 serves as a mask layer, a chemical-mechanical planarization (CMP) stopping layer (as described below), and a metal layer 18 capping layer (as described above), the at least partial removal of the SiCN dielectric mask layer 20 during processing of the intermediate semiconductor device 10 would lead to deterioration of the dielectric layer 16 and/or the metal layer 18. As a result, the at least partial removal of the SiCN dielectric mask layer 20 during processing of the intermediate semiconductor device 10 would lead to interlayer leakage and performance loss in the resulting integrated circuit. Advantageously, the SiNx cap layer 22 overlying the SiCN dielectric mask layer 20 protects the SiCN dielectric mask layer 20 from the etching, ashing and cleaning process, and thereby provides protection (the SiCN dielectric mask layer itself 20) to the underlying dielectric layer 16 and/or metal layer 18 during further processing of the intermediate semiconductor device 10.

Figure 3:
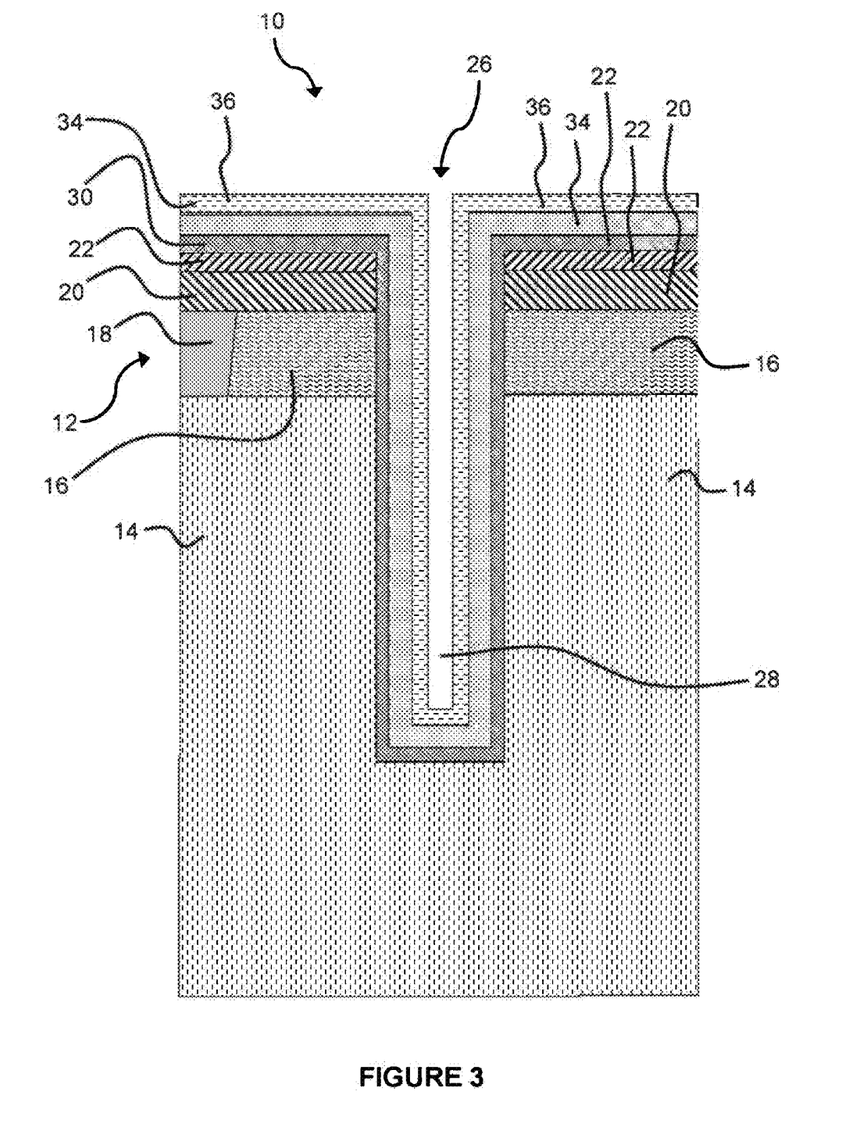
FIG. 3 exemplary embodiments of a process for fabricating, for instance, semiconductor devices and intermediate semiconductor devices with a dielectric mask protection layer, in accordance with one or more aspects of the present invention.

One such further process of the method of forming the intermediate semiconductor device 10 that would compromise or negatively affect the dielectric layer 16 and/or the metal layers 18 involves the formation of the TSV in the TSV opening 26 and trench 28. As shown in FIG. 3, after the formation of the TSV opening 26 and the TSV trench 28 in the SiNx cap layer 22, the first SiCN dielectric mask layer 20, and the dielectric layer 20 (and potentially the substrate 14) via etching and the cleaning the intermediate semiconductor device 10 thereafter, the method of forming the intermediate semiconductor device 10 may include forming or filling the TSV by applying an oxide isolation layer or TSV offside insulation liner 30 over the interior surfaces of the trench 28 and overfilled on a top surface of the SiNx cap layer 22. In some embodiments, the oxide isolation layer or liner 30 may be a nitride layer, or a combination of oxide and nitride layer.

In some embodiments, the oxide isolation layer or liner 30 may be applied to the interior surfaces of the trench 28 and on the top surface of the SiNx cap layer 22 via physical vapor deposition (PVD) or chemical vapor deposition (CVD). For example, as shown in FIG. 3, the oxide isolation layer 30 may be applied to the top surface of the SiNx cap layer 22, the surfaces of the SiNx cap layer 22 forming or facing the interior of the trench 28, the surfaces of the first SiCN dielectric mask layer 20 forming or facing the interior of the trench 28 below the SiNx cap layer 22, the surfaces of the dielectric layer 16 forming or facing the interior of the trench 28 below the first SiCN dielectric mask layer 20, and, potentially, the surfaces of the substrate 14 forming or facing the interior and bottom surface of the trench 28 below the dielectric layer 16.

As shown in FIG. 3, the method of forming the intermediate semiconductor device 10 may include forming a conformal electrically conductive layer or liner 32 after the oxide isolation layer or liner 30 is formed. In some embodiments, the conformal electrically conductive layer or liner 32 may be formed on or over the oxide isolation layer 30 within the trench 28 and overfilled on the top surfaces of the oxide isolation layer or liner 30 of the intermediate semiconductor device 10 adjacent to the trench 28. As shown in FIG. 3, in some embodiments the conformal electrically conductive layer or liner 32 includes a barrier layer 34 and a seed layer 36.

As also shown in FIG. 3, the method of forming the intermediate semiconductor device 10 may include forming the barrier layer 34 of the conformal electrically conductive layer or liner 32 on or overlying oxide isolation layer or liner 30. In some embodiments, the barrier layer 34 may be formed on or over the oxide isolation layer 30 within the trench 28 and overfilled on the top surfaces of the oxide isolation layer 30 adjacent to the trench 28, as shown in FIG. 3. The barrier layer 34 may be applied to the oxide isolation layer 30 by PVD or CVD. In some embodiments, the barrier layer 34 may be Ta or TaN. In some embodiments, the seed layer 36 of the conformal electrically conductive layer 32 may be formed on or over the barrier layer 34 within the trench 28 and overfilled on the top surfaces of the barrier layer 34 adjacent to the trench 28, as shown in FIG. 3. The seed layer 36 may be applied to the barrier layer 32 by PVD or CVD. In some embodiments, the seed layer 36 may substantially be Cu.

After the conformal electrically conductive layer or liner 32 is formed, the method of forming the intermediate semiconductor device 10 may include plating 38 the seed layer, such as with the same or similar material of the seed layer 36, to form the filled TSV as shown in FIG. 4. In some embodiments, the plating 38 of the seed layer 36 may include a gap fill process through physical vapor deposition or chemical vapor deposition or an atomic layer deposition. As shown in FIG. 4 the plating 38 of the seed layer 36 may substantially fill the trench 28 of the intermediate semiconductor device 10 to substantially form the TSV, and overfill the trench 28 to add a thicker layer 38 of the seed material 36 over the top surfaces of the barrier layer 34 adjacent the TSV as compared to the thickness of just the seed layer 36. After playing, the plated intermediate semiconductor device 10 with filled TSV may then be annealed. In some embodiments, the annealing of the intermediate semiconductor device 10 may include laser annealing, E-beam annealing or microwave annealing.

Once the TSV is formed or filled and the intermediate semiconductor device 10 is annealed, the oxide isolation 30, barrier 34, seed 36 and plating 38 layers overfilling the trench 28 on the top surface of the intermediate semiconductor device 10 adjacent the TSV may be removed, as shown in FIG. 5. In some embodiments, such layers may be removed via chemical mechanical polishing (CMP). Removal of the excess layers over or on the first SiCN dielectric mask layer 20 of the intermediate semiconductor device 10 (see FIG. 4) may leave a planarized top surface of the first SiCN dielectric mask layer 20 (and/or the SiNx cap layer) for subsequent semiconductor fabrication processes to be performed. In some embodiments, after the CMP process the intermediate semiconductor device 10 is further annealed, the step height of the TSV seed 36 and plating 38 is measured, and the intermediate semiconductor device 10 is buffer polished to leave a planarized top surface of the first SiCN dielectric mask layer 20 (and/or the SiNx cap layer) and the top surface of the TSV for further processing thereon. For example, a second interconnect level may be formed atop (overlying) the first interconnect level 12 (not shown).

As the dielectric layer 16 lacks selectivity to the CMP process, the first SiCN dielectric mask layer 20 must provide a stop surface or otherwise prevent the CMP process from polishing off at least a portion of the metal layer 18 (and the dielectric layer 16). As the method of forming a semiconductor device 10 includes forming, providing or obtaining a SiNx cap layer 22 over the first SiCN dielectric mask layer 20 to protect the SiCN dielectric mask layer 20 from deterioration during ashing and cleaning (and, potentially, other pre-CMP fabrication processes), the first SiCN dielectric mask layer 20 is able to adequately or properly stop the CMP process from removing at least a portion of the metal layer 18 (and potentially the dielectric layer 16), as shown by the SiNx cap layer 222 overlying the first SiCN dielectric mask layer 220 of the exemplary intermediate semiconductor device 210 of FIG. 6A. it is noted, however, that in some exemplary embodiments at least portions of the SiNx cap layer 222 may be removed by during the processing of the intermediate semiconductor device 210, such as by the ashing, cleaning, CMP and buffer polishing processes. As such, the as-fabricated intermediate semiconductor device 210 of FIG. 6A may not include the SiNx cap layer 222 over the first SiCN dielectric mask layer 220.

The exemplary intermediate semiconductor device 210 of FIG. 6A illustrates an intermediate semiconductor device 210 formed by the process of FIGS. 1-5 according to the present disclosure. As shown in FIG. 6A, the intermediate semiconductor device 210 includes a substantially thick SiCN dielectric mask layer 220 such that it is effective in properly stopping the CMP process from removing at least a portion of the metal layer 218 (and the dielectric layer 216). The SiNx cap layer 222 overlying the SiCN dielectric mask layer 220 may or may not be removed during processing (e.g., ashing, cleaning, CMP, etc.). In some embodiments, the ashing protection of the SiCN dielectric mask layer 220 provided by the SiNx cap layer 222 of an exemplary intermediate semiconductor device 210 may result in at least about 75% increase in thickness of the SiCN dielectric mask layer 220 after oxygen-based ashing of the photoresist (see FIGS. 1 and 2) as compared to a substantially identical intermediate semiconductor device embodiments without the use of the SiNx cap layer 222.

Similarly, in some exemplary intermediate semiconductor device embodiments 210 oxygen-based ashing of a photoresist (see FIGS. 1 and 2) on the SiCN dielectric mask layer 220 protected by the SiNx cap layer 22 (i.e., the SiNx cap layer 222 between the photoresist and the SiCN dielectric mask layer 220 (see FIG. 1)) may result in the first SiCN dielectric mask layer 220 including an AES percentage of less than or equal to about 36% and an oxygen penetration to about 5 nanometers or less. Such metrics represent a decrease in AES percentage of about 25% and a decrease in oxygen penetration of about 50% as compared to a substantially identical intermediate semiconductor device embodiment without the SiNx cap layer 222.

Figure 6B:
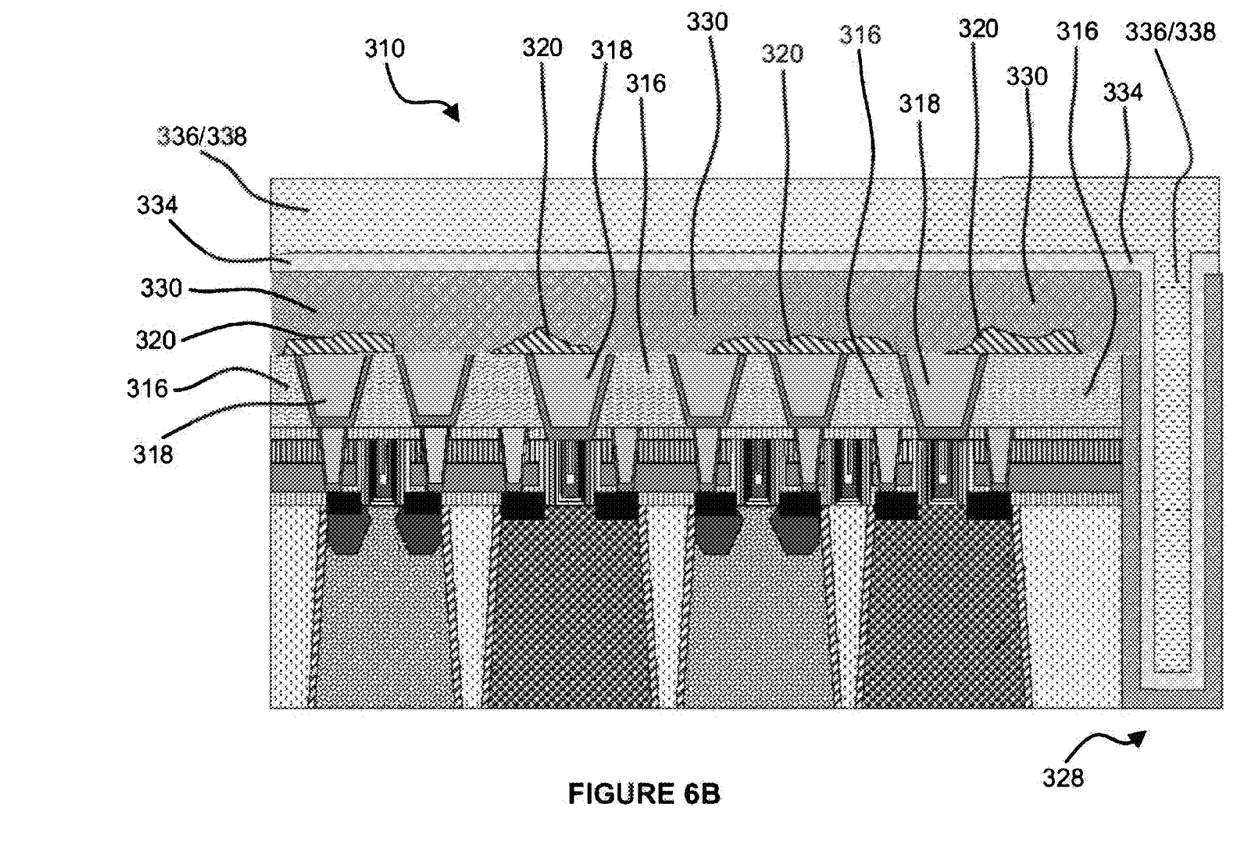
FIG. 6B depicts a portion of an intermediate semiconductor device before chemical-mechanical polishing of the device, showing the advantages of aspects of the present invention.

In this way, as shown in FIG. 6B, in exemplary intermediate semiconductor device embodiments 300 not including the SiNx cap layer (see FIG. 6A) protecting the SiCN dielectric mask layer 320, portions of the SiCN dielectric mask layer 320 would either be completely stripped or substantially thinned during the fabrication processes (e.g., ashing, cleaning, etc.) to a thickness that would be ineffective in properly stopping the CMP process from removing at least a portion of the metal layer 318 (and the dielectric layer 316). For example, at least about 25%, and potentially at least about 40%, of the as-deposited SiCN dielectric mask layer 320 may be lost during fabrication (e.g., ashing, cleaning, etc.) without the use of the SiNx cap layer protecting the SiCN dielectric mask layer 320.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of forming a semiconductor device, said method comprising:
   obtaining a substrate having at least one of a dielectric layer and a metal layer;
   forming a first SiCN dielectric mask layer on a top surface of at least one of the dielectric layer and a metal layer;
   forming a silicon nitride (SiNx) cap layer on a top surface of the first SiCN dielectric mask layer of a thickness of about 1 nm to about 6 nm;

forming a photoresist layer on a top surface of the SiNx cap layer;

utilizing the photoresist layer to form at least an opening in the SiNx cap layer and the first SiCN dielectric mask layer; and removing the photoresist layer and at least a portion of the SiNx cap layer via an oxygen plasma ashing process.

2. The method according to claim 1, wherein forming a SiNx cap layer includes forming a SiNx cap layer having a thickness non-uniformity (NU %) of less than or equal to about 2%.

3. The method according to claim 1, wherein the dielectric layer comprises tetraethyl orthosilicate (TEOS) or a low k dielectric material, and the metal layer comprises W, Al or Cu.

4. The method according to claim 1, wherein the forming a first SiCN dielectric mask layer forms a nitrogen-doped silicon carbide mask layer having a thickness of about 5 to about 50 nm.

5. The method according to claim 1, wherein forming a SiNx cap layer includes forming a SiNx cap layer having a thickness non-uniformity (NU %) of less than or equal to about 2%.

6. The method according to claim 1, wherein forming a silicon nitride (SiNx) cap layer on a top surface of the SiCN dielectric mask layer includes depositing SiNx on top surface of the first SiCN dielectric mask layer via a plasma enhanced chemical vapor deposition (PECVD) process.

7. The method according to claim 6, wherein the PECVD process deposits the SiNx cap layer by utilizing $N_2$ at a flow rate within the range of about 1,000 to about 20,000 sccm and $SiH_4$ at a flow rate within the range of about 50 to about 500 sccm.

8. A method of forming a semiconductor device, said method comprising:

obtaining a substrate having at least one of a dielectric layer and a metal layer;

forming a first SiCN dielectric mask layer on a top surface of at least one of the dielectric layer and a metal layer;

forming a silicon nitride (SiNx) cap layer on a top surface of the first SiCN dielectric mask layer of a thickness of about 1 nm to about 6 nm;

forming a photoresist layer on a top surface of the SiNx cap layer;

utilizing the photoresist layer to form an opening in the SiNx cap layer and the first SiCN dielectric mask layer;

forming a trench in the dielectric layer;

removing at least the photoresist layer and at least a portion of the SiNx cap layer via an oxygen plasma ashing process;

forming a conformal electrically conductive liner within the trench;

depositing a core electrical conductor within the trench; and removing portions of at least one of the electrically conductive liner and the core electrical conductor by using the dielectric mask layer as a process stop layer.

9. The method according to claim 8, further comprising forming a second SiCN dielectric mask layer on the first SiCN dielectric mask layer, and the conformal electrically conductive liner and core electrical conductor within the trench, after the removing portions of at least one of the electrically conductive liner and the core electrical conductor.

10. An intermediate semiconductor device comprising:

a substrate having at least one of a metal layer and a dielectric layer including a trench;

a first SiCN dielectric mask layer on a top surface of at least one of the dielectric layer and a metal layer;

a silicon nitride (SiNx) cap layer about 1 nm to about 6 nm thick on a top surface of the first SiCN dielectric mask layer;

a conformal electrically conductive liner and a core electrical conductor within the trench; and a second SiCN dielectric mask layer on the first SiCN dielectric mask layer, wherein the SiNx cap layer and the first SiCN dielectric mask layer include an opening.

11. The device of claim 10, further including a photoresist layer on a top surface of the SiNx cap layer.

12. The device of claim 11, wherein the opening in the SiNx cap layer and the first SiCN dielectric mask layer is formed via the photoresist layer.

13. The device of claim 12, wherein the SiNx cap layer has a thickness non-uniformity (NU %) of less than or equal to about 2%.

14. The device of claim 10, wherein the SiNx cap layer has a thickness non-uniformity (NU %) of less than or equal to about 2%.

15. The device of claim 10, wherein the dielectric layer comprises tetraethyl orthosilicate (TEOS) or a low k dielectric material, and the metal layer comprises W, Al or Cu.

16. The device of claim 10, wherein the first SiCN dielectric mask layer is nitrogen-doped silicon carbide mask layer having a thickness of about 5 to about 50 nm.

* * * * *